US007442489B2

(12) United States Patent
Kim et al.

(10) Patent No.: US 7,442,489 B2

(45) Date of Patent: Oct. 28, 2008

(54) PHOTORESIST COMPOSITION AND METHOD OF FORMING A PHOTORESIST PATTERN USING THE SAME

(75) Inventors: Boo-Deuk Kim, Gyeonggi-do (KR); Jin-A Ryu, Seoul (KR); Jae-Ho Kim, Gyeonggi-do (KR); Young-Ho Kim, Gyeonggi-do (KR); Kyoung-Mi Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 189 days.

(21) Appl. No.: 11/334,200

(22) Filed: Jan. 17, 2006

(65) Prior Publication Data

US 2006/0160021 A1 Jul. 20, 2006

(30) Foreign Application Priority Data

Jan. 18, 2005 (KR) ...................... 10-2005-0004494

(51) Int. Cl.
*G03F 7/00* (2006.01)
*G03F 7/004* (2006.01)

(52) U.S. Cl. ..................... 430/270.1; 430/913; 430/917

(58) Field of Classification Search ............. 430/270.1, 430/905, 913, 917
See application file for complete search history.

(56) References Cited

U.S. PATENT DOCUMENTS

| | | | | |
|---|---|---|---|---|
| 5,633,106 | A * | 5/1997 | Aihara et al. | 430/21 |
| 5,696,758 | A * | 12/1997 | Yanagimachi et al. | 369/275.4 |
| 5,719,291 | A * | 2/1998 | Aoki et al. | 548/262.2 |
| 5,858,613 | A * | 1/1999 | Monden et al. | 430/270.16 |
| 6,168,839 | B1 * | 1/2001 | Fujita et al. | 428/1.1 |
| 6,677,395 | B1 * | 1/2004 | Dang et al. | 524/432 |
| 2002/0119391 | A1 | 8/2002 | Barclay et al. | |

FOREIGN PATENT DOCUMENTS

| | | |
|---|---|---|
| JP | 2002-006495 | 1/2002 |
| JP | 2002-023373 | 1/2002 |

OTHER PUBLICATIONS

English language abstract of Japanese Publication No. 2002-006495.
English language abstract of Japanese Publication No. 2002-023373.

* cited by examiner

*Primary Examiner*—Amanda C. Walke
(74) *Attorney, Agent, or Firm*—Marger Johnson & McCollom, P.C.

(57) ABSTRACT

In a photoresist composition for a semiconductor manufacturing process and a method of forming a photoresist pattern using the photoresist composition, the photoresist composition includes an organic dispersing agent for dispersing acid (H+). The photoresist film may have enough spaces among photosensitive polymers so that acid may be dispersed sufficiently in an exposure process. Thus, a photoresist pattern may be easily formed in a defocus region. Defects in a semiconductor device may be reduced and a productivity of the semiconductor manufacturing process may be enhanced.

16 Claims, 5 Drawing Sheets

42

44

40

PHOTORESIST COMPOSITION AND METHOD OF FORMING A PHOTORESIST PATTERN USING THE SAME

CROSS-REFERENCE TO RELATED APPLICATION

This application claims priority under 35 USC § 119 to Korean Patent Application No. 2005-0004494 filed on Jan. 18, 2005, the contents of which are herein incorporated by references in their entirety.

BACKGROUND OF THE INVENTION

1. Field of the Invention

Example embodiments of the present invention relate to a photoresist composition and a method of forming a photoresist pattern using the photoresist composition. More particularly, embodiments of the present invention relate to a photoresist composition employed in a semiconductor manufacturing process and to a method of forming a photoresist pattern using the photoresist composition.

2. Description of the Related Art

As information processing apparatuses have been developed, semiconductor devices having high integration degrees and rapid response speeds are desired. Hence, the technology of manufacturing the semiconductor devices has been developed to improve integration degrees, reliabilities and response speeds of the semiconductor devices. Accordingly, the requirements for a micro-fabrication technology such as a photolithography process have become strict.

In a semiconductor manufacturing process, a photoresist composition is used for the photolithography process. The solubility of the photoresist composition varies with respect to a developing solution and a light in an exposure process, and thus an image corresponding to a pattern exposed to the light is obtained. Photoresist is generally classified as either a positive photoresist or a negative photoresist. In the positive photoresist, a portion exposed to a light has an enhanced solubility relative to a specific developing solution. The portion exposed to the light of the positive photoresist is removed in a developing process so that a desired pattern is obtained. On the other hand, a portion exposed to a light of the negative photoresist has a reduced solubility relative to a specific developing solution. Thus, an unexposed portion of the negative photoresist is removed in the developing process to thereby form a desired pattern.

The photoresist composition generally includes a photosensitive polymer and a photoacid generator. The photoacid generator is material that generates acid (H+) in response to light in an exposure process. Acid generated from the photoacid generator reacts with a blocking group in the photosensitive polymer so that the photosensitive polymer is transformed into the state soluble to a specific solvent.

As an integration degree of a semiconductor device has been increased, a photoresist composition for forming a pattern having a high resolution has been required. A dispersion distance of acid generated from the photoacid generator is reduced, so a margin of a depth of focus decreases. Accordingly, a precise formation of minute pattern is practically difficult.

FIGS. 1 and 2 are cross sectional views illustrating a method of forming a photoresist pattern using a conventional photoresist composition.

Referring to FIG. 1, a photoresist film 20 is formed on a substrate 10 by coating a photoresist composition. A portion of the photoresist film 20 is exposed to a light using a mask (not shown). Then, a photoacid generator in the photoresist composition generates acid (H+) in an exposure process. However, sufficient light may not reach a lower portion of the photoresist film 20 so that the photoacid generator included in the lower portion of the photoresist film 20 may not generate a sufficient amount of acid.

Referring to FIG. 2, an exposed portion of the photoresist film 20 is removed from the substrate 10 in a developing process to form a photoresist pattern 22. Then, as acid is not sufficiently dispersed in the lower portion of the photoresist film 20, a pattern having a desired shape is not exactly formed. When a minute pattern is required, the above-mentioned problem becomes more serious.

Therefore, it would be desirable to have a photoresist composition that exhibits good reproducibility and a high resolution by readily dispersing acid therein.

SUMMARY

Embodiments of the present invention provide a photoresist composition having a high resolution. Embodiments of the present invention also provide a method of forming a photoresist pattern using the photoresist composition.

A photoresist composition includes an organic dispersing agent for dispersing acid (H+). The organic dispersing agent may include a compound including at least one carbon-carbon double bond. The organic dispersing agent may include 1,1'-(1,1,3-trimethyl-1,3-propanediyl)biscyclohexane, propylcyclohexane, (E)-dec-5-ene and dec-1-ene.

The organic dispersing agent may have a molecular weight in a range of from about 50 up to about 600, more preferably from about 100 up to about 300. The photoresist composition may includes from about 0.01 up to about 1 percent by weight of the organic dispersing agent, based on a total weight of the photoresist composition, more preferably from about 0.1 up to about 0.6 percent by weight of the organic dispersing agent, based on the total weight of the photoresist composition.

The photoresist composition may include a photosensitive polymer, a photosensitive material, an organic dispersing agent for dispersing acid (H+) and an organic solvent. The photoresist composition may include from about 0.1 up to about 15 parts by weight of the photosensitive material, from about 0.1 up to about 10 parts by weight of the organic dispersing agent and from about 500 up to about 1500 parts by weight of the organic solvent, based on about 100 parts by weight of the photosensitive polymer. The photoresist composition includes from about 0.1 up to about 15 parts by weight of the photosensitive material, from about 1 up to about 6 parts by weight of the organic dispersing agent and from about 500 to up about 1500 parts by weight of the organic solvent, based on about 100 parts by weight of the photosensitive polymer.

The photoresist composition may include sulfonium salt, triarylsulfonium salt, iodonium salt, diaryliodonium salt, nitrobenzyl ester, disulfone, diazo-disulfone, sulfonate, trichloromethyl triazine and N-hydroxysuccinimide triflate. The organic solvent may include ethyleneglycolmonomethylether, ethyleneglycolmonoethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone and 4-heptanone.

The photoresist composition may include an organic base. The organic base may include from about 0.01 up to about 20 parts by weight, based on about 100 parts by weight of the photosensitive polymer. The organic base may include triethylamine, triisobutylamine, triisooctylamine, triisodecylamine, diethanolamine and triethanolamine.

A method of forming a photoresist pattern can also be provided. This method includes forming a photoresist film on an object by coating thereon a photoresist composition including an organic dispersing agent for dispersing acid (H+), forming a mask having said photoresist pattern, exposing the photoresist film to a light passing through the mask and removing an exposed portion of the photoresist film to form the photoresist pattern on the object.

According to the present invention, when a photoresist film is formed using a photoresist composition that includes an organic dispersing agent for dispersing acid (H+), the photoresist film may have enough spaces among photosensitive polymers, so that acid may be sufficiently dispersed in a light-exposure process. Thus, a photoresist pattern may be easily formed on a defocus region. As a result, a defect in a semiconductor device may be reduced and a productivity of the semiconductor manufacturing process may be enhanced.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1:
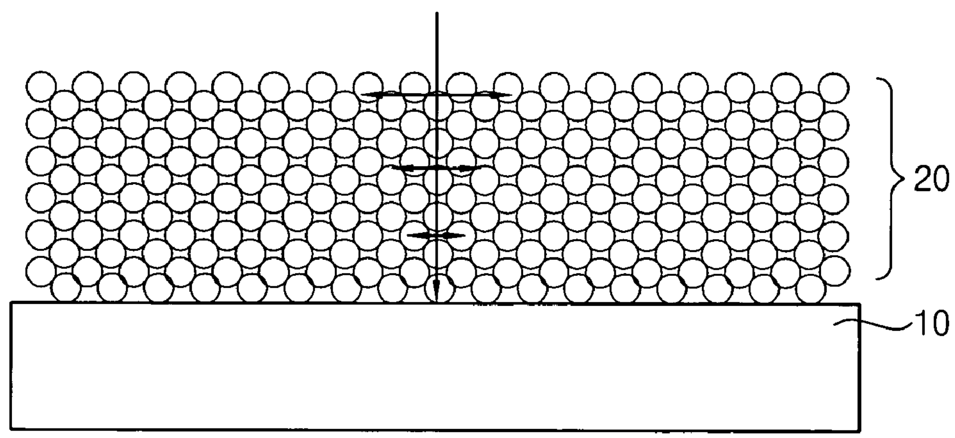
FIGS. 1 and 2 are cross-sectional views illustrating a method of forming a photoresist pattern using a conventional photoresist composition.
Figure 2:
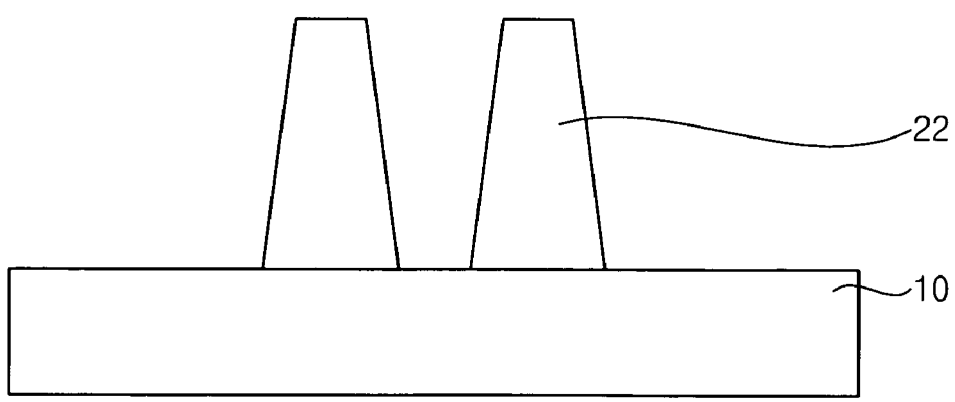

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition

A photoresist composition of the present invention includes an organic dispersing agent for dispersing acid (H+). The organic dispersing agent may create spaces within photosensitive polymers included in the photoresist composition so that acid may be readily dispersed.

Figure 3:
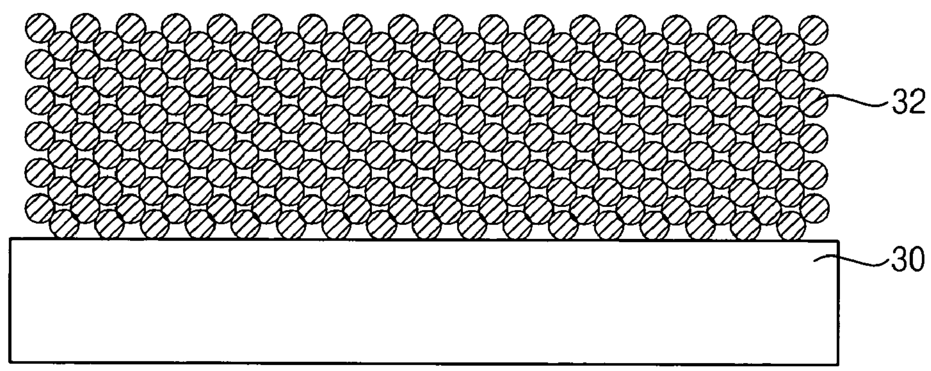
FIG. 3 is a cross-sectional view illustrating a photoresist film formed using a conventional photoresist composition.
Figure 4:
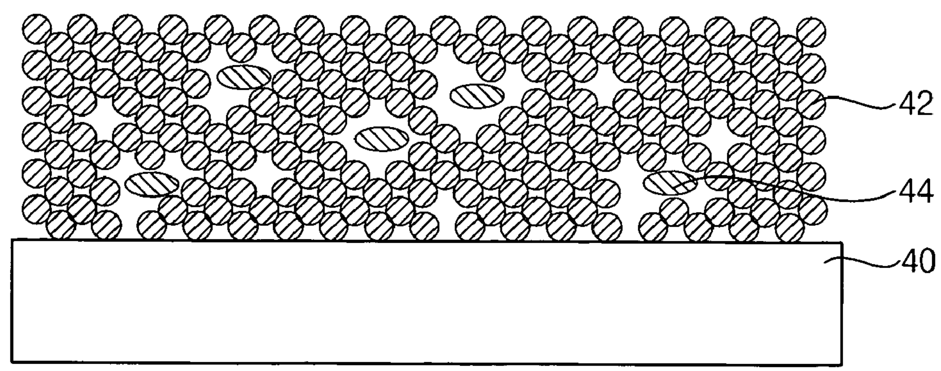
FIG. 4 is a cross-sectional view illustrating a photoresist film in accordance with an embodiment of the present invention.

FIG. 3 is a cross-sectional view illustrating a photoresist film using a conventional photoresist composition. FIG. 4 is a cross-sectional view illustrating a photoresist film using a photoresist composition in accordance with an example embodiment of the present invention.

Referring to FIG. 3, when a conventional photoresist film is formed on a substrate 30 using a conventional photoresist composition, spaces may not be sufficiently formed within photosensitive polymers 32. Thus, acid (H+) generated from a photosensitive material may not be sufficiently dispersed. This phenomenon becomes more serious at a lower portion of the conventional photoresist film where a sufficient amount of light may not be transmitted.

Referring to FIG. 4, when a photoresist film is formed on a substrate 40 using a photoresist composition according to an embodiment of the present invention, an organic dispersing agent 44 in the photoresist composition creates spaces within photosensitive polymers 42. Thus, acid (H+) generated from a photosensitive material may be readily dispersed. The organic dispersing agent 44 included in the photoresist composition of the present invention may especially make spaces for dispersing acid at a lower portion of the photoresist film where a sufficient amount of light may not be transmitted. As a result, the photoresist pattern having a good profile may be formed on the substrate 40.

In an embodiment of the present invention, the organic dispersing agent may include an organic compound. In addition, the organic dispersing agent may include an olefin compound having at least one carbon-carbon double bond. Examples of the organic dispersing agent of the present invention include 1,1'-(1,1,3-trimethyl-1,3-propanediyl) biscyclohexane, propylcyclohexane, (E)-dec-5-ene, dec-1-ene, etc. These can be used alone or in a mixture thereof.

When the organic dispersing agent has a molecular weight of less than about 50, sufficient spaces may not be formed within the photosensitive polymers included in the photoresist composition. Thus, the organic dispersing agent may have an insufficient effect on increasing a dispersion distance of acid. Moreover, when the organic dispersing agent has the molecular weight of more than about 600, the photoresist pattern formed using the photoresist composition may have a great line edge roughness and also may be etched excessively in a subsequent etching process. Therefore, the organic dispersing agent may preferably have an average molecular weight of from about 50 up to about 600, and more preferably, the organic dispersing agent has a molecular weight of from about 100 up to about 300.

When the photoresist composition includes the organic dispersing agent in an amount of less than about 0.01 percent by weight, based on a total weight of the photoresist composition, the organic dispersing agent may have an insufficient effect on increasing of a depth of focus. In addition, when the photoresist composition includes the organic dispersing agent in an amount of more than about 1 percent by weight, a dispersion distance of acid may increase excessively so that a minute pattern may not be exactly formed. Therefore, the photoresist composition includes an organic dispersing agent in an amount of from about 0.01 up to about 1 percent by weight, based on the total weight of the photoresist composition. The photoresist composition includes the organic dispersing agent in an amount of from about 0.1 up to about 0.6 percent by weight, based on the total weight of the photoresist composition.

In an embodiment of the present invention, a photoresist composition includes a photosensitive polymer, a photosensitive material, an organic dispersing agent for dispersing acid (H+) and an organic solvent.

The organic dispersing agent may include an organic compound such as 1,1'-(1,1,3-trimethyl-1,3-propanediyl)biscyclohexane, propylcyclohexane, etc. In addition, the organic dispersing agent may include an olefin compound having at least one carbon-carbon double bond. The organic dispersing agent preferably has a molecular weight of from about 50 up to about 600, and the organic dispersing agent more preferably has a molecular weight in a range of from about 100 up to about 300.

The photoresist composition of the present invention may preferably include an organic dispersing agent of from about 0.01 up to about 10 parts by weight, and more preferably includes the organic dispersing agent of from about 1 up to about 6 parts by weight, based on about 100 parts by weight of the photosensitive polymer.

When the photoresist composition of the present invention includes the photosensitive material of less than about 0.1 parts by weight, based on about 100 parts by weight of the photosensitive polymer, acid may not be sufficiently generated in an exposure process. Thus, a developing rate of an exposed portion of the photoresist composition may be disadvantageously deteriorated. In addition, when the content of the photosensitive material is greater than about 15 parts by weight, the light absorbance may excessively increase and a lower portion of a photoresist film may not be sufficiently exposed to a light so that a precise pattern may not be obtained. Thus, the photoresist composition of the present invention includes from about 0.1 up to about 15 parts by weight of the photosensitive material, based on about 100 parts by weight of the photosensitive polymer.

Examples of the photosensitive material include sulfonium salt, triarylsulfonium salt, iodonium salt, diaryliodonium salt, nitrobenzyl ester, disulfone, diazo-disulfone, sulfonate, trichloromethyl triazine, N-hydroxysuccinimide triflate, etc. These can be used alone or in a mixture thereof.

Examples of the photosensitive material include triphenylsulfonium triflate, triphenylsulfonium antimony salt, diphenyliodonium triflate, diphenyliodonium antimony salt, methoxydiphenyliodonium triflate, di-tert-butyldiphenyliodonium triflate, 2,6-dinitrobenzyl sulfonate, pyrogallol tris (alkylsulfonate), norbornene-dicarboxyimide triflate, triphenylsulfonium nonaflate, diphenyliodonium nonaflate, methoxydiphenyliodonium nonaflate, di-tert-butyldiphenyliodonium nonaflate, N-hydroxysuccinimide nonaflate, norbornene dicarboxyimide nonaflate, triphenylsulfonium perfluorooctanesulfonate, diphenyliodonium perfluorooctanesulfonate, methoxyphenyliodonium perfluorooctanesulfonate, di-tert-butyldiphenyliodonium triflate, N-hydroxysuccinimide perfluorooctanesulfonate, norbornene dicarboxyimide perfluorooctanesulfonate, etc. These can be used or in a mixture thereof.

When the photoresist composition of the present invention includes the organic solvent of less than about 500 parts by weight, based on about 100 parts by weight of the photosensitive polymer, viscosity of the photoresist composition may excessively increase so that a photoresist film having a uniform thickness may not be formed. In addition, when the content of the organic solvent is greater than about, 1500 parts by weight, a photoresist film having a sufficient thickness may not be formed. Thus, the photoresist composition of the present invention includes from about 500 up to about 1,500 parts by weight of the organic solvent, based on about 100 parts by weight of the photosensitive polymer.

Examples of the organic solvent include ethyleneglycolmonomethylether, ethyleneglycolmonoethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone, 4-heptanone, etc. These can be used alone or in a mixture thereof.

In an embodiment of the present invention, the photoresist composition may further include an organic base. The organic base may prevent a photoresist pattern from being damaged by a basic compound such as an amine contained in an atmosphere, and may serve to control the shape of the photoresist pattern.

When the photoresist composition includes the organic base of less than about 0.01 parts by weight, based on about 100 parts by weight of the photosensitive polymer, the photoresist pattern having a desired shape may not be exactly formed. In addition, the organic base of greater than about 20 parts by weight may be economically disadvantageous. Thus, the photoresist composition of the present invention includes from about 0.01 up to about 20 parts by weight of the organic base, based on about 100 parts by weight of the photosensitive polymer.

Examples of the organic base of the present invention include triethylamine, triisobutylamine, triisooctylamine, triisodecylamine, diethanolamine, triethanolamine, etc. These can be used alone or in a mixture thereof.

The photoresist composition of the present invention may further include an additive such as a surfactant, a sensitizer, an adhesive, a preservation stabilizer, etc. Examples of the surfactant of the present invention may include an ether compound such as polyoxyethylene lauryl ether, polyoxyethylene stearyl ether, polyoxyethylene oleyl ether, polyoxyethylene nonyiphenyl ether and the like. The sensitizer, the adhesive and the preservation stabilizer of the present invention may include an amine-based compound and the like. The photoresist composition of the present invention preferably includes less than about 5 parts by weight of the additive based on about 100 parts by weight of the photosensitive polymer.

Method of Forming a Photoresist Pattern

Figure 5:
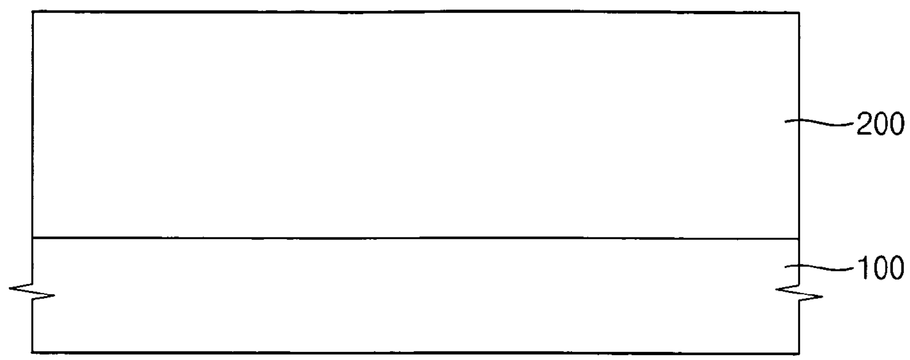
FIGS. 5 to 7 are cross-sectional views illustrating a method of forming a photoresist pattern in accordance with an embodiment of the present invention.
Figure 6:
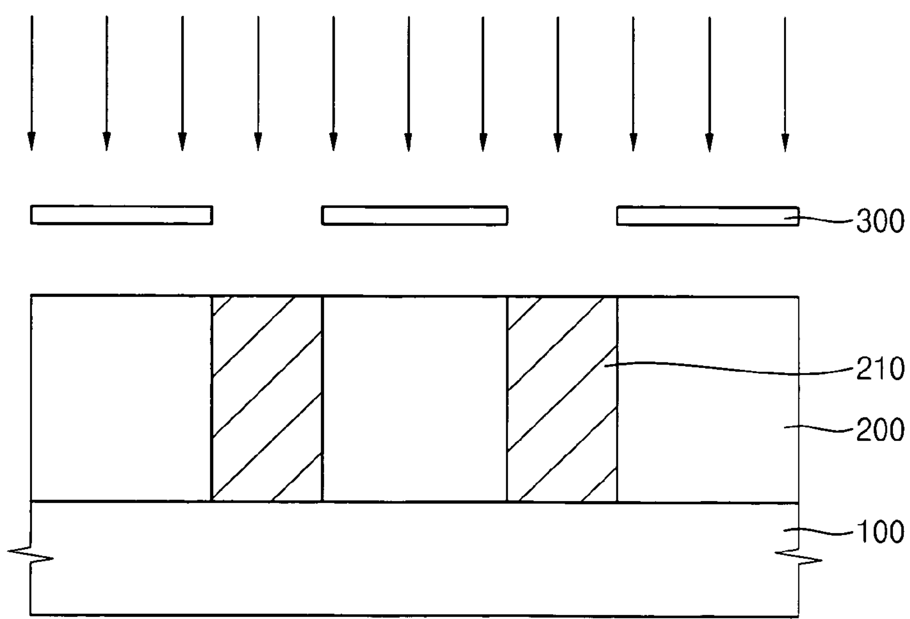
Figure 7:
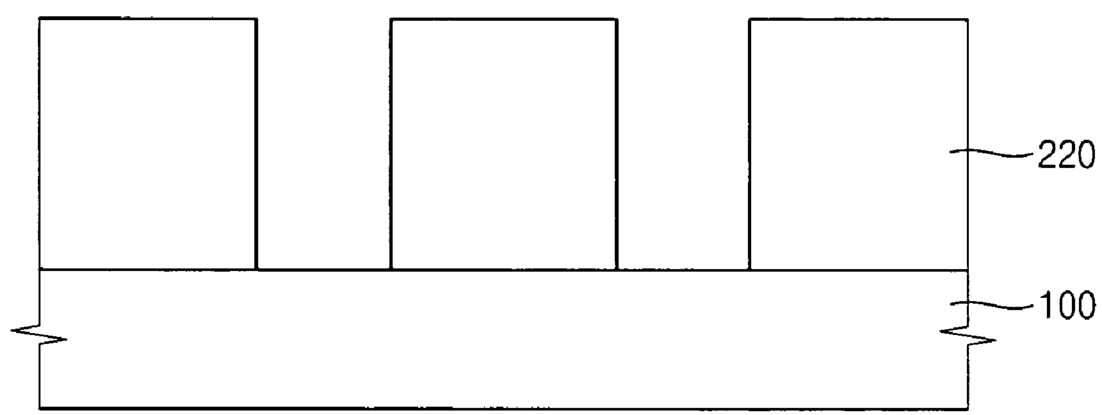

FIGS. 5 to 7 are cross-sectional views illustrating a method of forming a photoresist pattern in accordance with an embodiment of the present invention.

Referring to FIG. 5, an object is provided. A substrate 100 such as a silicon wafer may be used as the object. Alternatively, an insulation layer, a conductive layer or the like may be employed for the object. Further, a predetermined structure may be formed on the substrate 100.

A surface treatment process may be selectively performed for the substrate 100 to remove moisture and/or contaminants from the substrate 100. The moisture and/or the contaminants on the substrate 100 may deteriorate adhesive strength of a photoresist film 200 relative to the substrate 100. In the surface treatment process, the substrate 100 may be fixed on a rotation chuck, and then a fabric brush rotating at a high speed may make contact with the substrate 100. Thus, the substrate 100 may be cleaned rapidly and also the moisture and/or the contaminants may be effectively removed from the substrate 100.

The photoresist film 200 is formed on the substrate 100 by coating a photoresist composition including an organic dispersing agent for dispersing acid (H+). The photoresist film 200 may be formed by a spin-coating process. In an example embodiment of the present invention, the photoresist film 200 may be uniformly formed on the substrate 200 by coating the photoresist composition while rotating the chuck having the substrate 100 thereon at a high speed. In a further embodiment of the present invention, an anti-reflective layer (not shown) may be further formed on the substrate 100 before a formation of the photoresist film 200.

The organic dispersing agent may preferably include an organic compound such as 1,1'-(1,1,3-trimethyl-1,3-propanediyl)biscyclohexane, propylcyclohexane, etc. In addition, the organic dispersing agent may preferably include an olefin compound having at least one carbon-carbon double bond, such as (E)-dec-5-ene, dec-1-ene, etc. The organic dispersing agent preferably has a molecular weight in a range of from about 50 up to about 600. More preferably, the organic dispersing agent preferably has a molecular weight in a range of from about 100 up to about 300.

The photoresist composition of the present invention may include an organic dispersing agent in an amount of from about 0.01 up to about 1 percent by weight, based on a total weight of the photoresist composition. More preferably, the photoresist composition may include the organic dispersing agent in an amount of from about 0.1 up to about 0.6 percent by weight.

A first baking process may be selectively performed for the substrate 100 including the photoresist pattern 200 thereon. The first baking process may be performed at a temperature of from about 90° C. up to about 120° C. The first baking process may remove an organic solvent included in the photoresist film 200 to enhance adhesive strength between the photoresist film 200 and the substrate 100.

Referring to FIG. 6, the substrate 100 is exposed to a light. For example, a mask 300 including a predetermined pattern is positioned on a mask stage of an exposure apparatus. The mask 300 is arranged relative to the substrate 100 including the photoresist film 200 in an alignment process. The light is irradiated onto photoresist film 200 through the mask 300 for a predetermined time so that a portion of the photoresist film 200 formed on the substrate 100 may selectively react with the light passing through the mask 300. The light may include a G-line ray, an I-line ray, a krypton fluoride laser, an argon fluoride laser, an electron beam, an X-ray, etc. Thus, an exposed portion 210 of the photoresist film 200 may have a solubility substantially different from a solubility of an unexposed portion of the photoresist film 200.

A second baking process may be additionally carried out for the substrate 100. The second baking process may be performed at a temperature of from about 90° C. up to about 150° C. In the second baking process, the solubility of the exposed portion 210 of the photoresist film 200 may be further changed so that the exposed portion 210 may be easily dissolved in a particular solvent.

Referring to FIG. 7, the exposed portion 210 of the photoresist film 200 is removed using a developing solution to thereby form the photoresist pattern 220 on the substrate 200. For example, the exposed portion 210 of the photoresist film 200 is removed using the developing solution such as tetramethylammonium hydroxide (TMAH) and the like.

Successive processes including a cleaning process may be preformed on the photoresist pattern 220 formed on the substrate 200. Various structures in a semiconductor device may be formed using the photoresist pattern 220 as an etching mask.

Hereinafter, the photoresist composition having the photosensitive polymer in accordance with example embodiments of the present invention will be further described through Example and Comparative Example.

Preparation of a Photoresist Composition

EXAMPLE

A photoresist composition was prepared by mixing about 10 percent by weight of polyhydroxystyrene (PHS) resin as a photosensitive polymer, about 0.1 percent by weight of sulfonate as a photosensitive material, about 0.05 percent by weight of trimethylamine as an organic base, about 0.4 percent by weight of dec-5-ene having a molecular weight of about 140.27 as an organic dispersing agent, and about 89.45 percent by weight of propyleneglycolmethylether as an organic solvent. The PHS resin had a molecular weight of about 12,000.

Comparative Example

A photoresist composition was prepared by mixing about 10 percent by weight of polyhydroxystyrene (PHS) resin as a photosensitive polymer, about 0.1 percent by weight of sulfonate as a photosensitive material, about 0.05 percent by weight of trimethylamine as an organic base, and about 89.85 percent by weight of propyleneglycolmethylether as an organic solvent. The PHS resin had a molecular weight of about 12,000.

Evaluation of a Depth Of Focus in a Photoresist Film

Photoresist films were respectively formed on substrates using the photoresist compositions prepared according to Example and Comparative Example. The photoresist films were exposed using a krypton fluoride (KrF) laser. Exposed portions of the photoresist films were removed using tetramethylammonium hydroxide (TMAH) solution having a concentration of about 2.38 percent. Thus, photoresist patterns were formed on the substrates. Here, an interval between photoresist patterns was about 0.1 μm.

Figure 8:
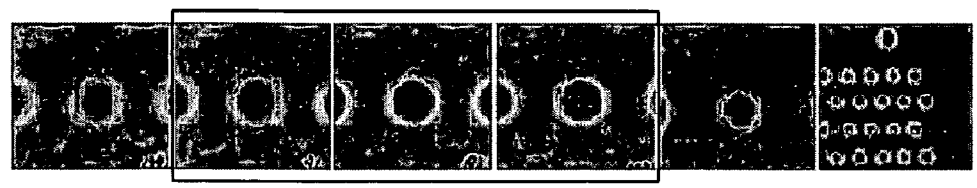
FIGS. 8 and 9 are electron microscopic pictures obtained using a scanning electron microscope (SEM) to illustrate photoresist patterns prepared according to Example and Comparative Example.
Figure 9:
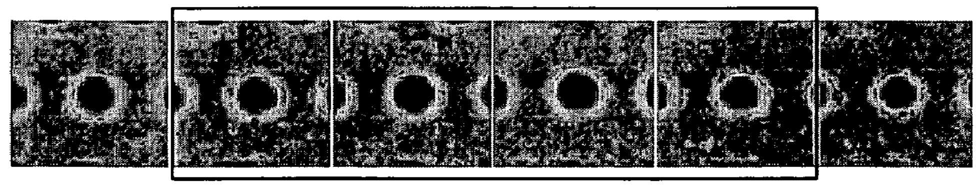

FIGS. 8 and 9 are electron microscopic pictures obtained using a scanning electron microscope (SEM) for illustrating the photoresist patterns prepared according to Example and Comparative Example. Particularly, FIG. 8 is an electron microscopic picture showing the photoresist pattern prepared according to Comparative Example, and FIG. 9 is an electron microscopic picture showing the photoresist pattern prepared according to Example.

Referring to FIGS. 8 and 9, the photoresist pattern of Comparative Example had a depth of focus of about 0.2 μm, whereas the photoresist pattern of Example had a depth of focus of about 0.3 μm. The photoresist pattern of Example had the increased depth of focus in comparison with that of the photoresist pattern of Comparative Example. Thus, when a photolithography process is performed using a photoresist composition that includes an organic dispersing agent for dispersing acid (H+), acid may be easily dispersed in a defocus region and a process margin of the photolithography process may be improved. Therefore, when a pattern is formed on an object by the photoresist pattern prepared using the photoresist composition of the present invention, minuter pattern may be formed precisely on the object.

According to some embodiments of the present invention, when a photoresist film is formed using a photoresist composition that includes an organic dispersing agent for dispersing acid (H+), the photoresist film may have enough spaces among photosensitive polymers so that acid may be dispersed sufficiently in an exposure process. Thus, a photoresist pattern may be easily formed in a defocus region. As a result, defects in a semiconductor device may be reduced and a productivity of the semiconductor manufacturing process may be enhanced.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A photoresist composition comprising an organic dispersing agent including an olefin compound having at least one carbon-carbon double bond for dispersing acid (H+), the organic dispersing agent further including (E)-dec-5-ene or dec-1-ene.

2. The photoresist composition of claim 1, wherein the organic dispersing agent has a molecular weight in a range of about 50 to about 600.

3. The photoresist composition of claim 1, wherein the organic dispersing agent has the molecular weight in a range of about 100 to about 300.

4. The photoresist composition of claim 1, wherein the photoresist composition comprises about 0.01 to about 1 percent by weight of the organic dispersing agent, based on a total weight of the photoresist composition.

5. The photoresist composition of claim 1, wherein the photoresist composition comprises about 0.1 to about 0.6 percent by weight of the organic dispersing agent, based on the total weight of the photoresist composition.

6. A photoresist composition comprising:

a photosensitive polymer;

a photosensitive material;

an organic dispersing agent including an olefin compound having at least one carbon-carbon double bond for dispersing acid (H+), the organic dispersing agent further including (E)-dec-5-ene or dec-1-ene; and an organic solvent.

7. The photoresist composition of claim 6, wherein the organic dispersing agent has a molecular weight in a range of about 50 to about 600.

8. The photoresist composition of claim 6, wherein the photoresist composition comprises about 0.1 to about 15 parts by weight of the photosensitive material, about 0.1 to about 10 parts by weight of the organic dispersing agent and about 500 to about 1500 parts by weight of the organic solvent, based on about 100 parts by weight of the photosensitive polymer.

9. The photoresist composition of claim 6, wherein the photoresist composition comprises about 0.1 to about 15 parts by weight of the photosensitive material, about 1 to about 6 parts by weight of the organic dispersing agent and about 500 to about 1500 parts by weight of the organic solvent, based on about 100 parts by weight of the photosensitive polymer.

10. The photoresist composition of claim 6, wherein the photosensitive material comprises at least one selected from the group consisting of sulfonium salt, triarylsulfonium salt, iodonium salt, diaryliodonium salt, nitrobenzyl ester, disulfone, diazo-disulfone, sulfonate, trichloromethyl triazine and N-hydroxysuccinimide triflate.

11. The photoresist composition of claim 6, wherein the organic solvent comprises at least one selected from the group consisting of ethyleneglycolmonomethylether, ethyleneglycolmonoethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone and 4-heptanone.

12. The photoresist composition of claim 6, further comprising an organic base.

13. The photoresist composition of claim 12, wherein the organic base comprises about 0.01 to about 20 parts by weight, based on about 100 parts by weight of the photosensitive polymer.

14. The photoresist composition of claim 12, wherein the organic base comprises at least one selected from the group consisting of triethylamine, triisobutylamine, triisooctylamine, triisodecylamine, diethanolamine and triethanolamine.

15. A method of forming a photoresist pattern comprising:

forming a photoresist film on an object by coating thereon a photoresist composition including an organic dispersing agent including an olefin compound having at least one carbon-carbon double bond for dispersing acid (H+), the organic dispersing agent further including (E)-dec-5-ene or dec-1-ene;

exposing the photoresist film to a light passing through a mask having a predetermined pattern; and removing an exposed portion of the photoresist film to form the photoresist pattern on the object.

16. The method of claim 15, wherein the organic dispersing agent has a molecular weight in a range of about 50 to about 600.

* * * * *

UNITED STATES PATENT AND TRADEMARK OFFICE

CERTIFICATE OF CORRECTION

PATENT NO. : 7,442,489 B2
APPLICATION NO. : 11/334200
DATED : October 28, 2008
INVENTOR(S) : Boo-Deuk Kim et al.

It is certified that error appears in the above-identified patent and that said Letters Patent is hereby corrected as shown below:

Column 6, line 65, the words "about, 1500" should read -- about 1,500 --;
Column 7, line 39, the word "nonyiphenyl" should read -- nonylphenyl --.

Signed and Sealed this

Thirtieth Day of June, 2009

JOHN DOLL
*Acting Director of the United States Patent and Trademark Office*